United States Patent [19]

Ishii et al.

[11] Patent Number: 5,266,385
[45] Date of Patent: Nov. 30, 1993

[54] PRINTED CIRCUIT COMPRISING NOVEL COMPOUNDS AS FLUORESCENCE MEANS TO CONTROL CIRCUIT QUALITY

[75] Inventors: Kenji Ishii; Yoshinori Kondo; Hiroyuki Matsumoto; Norio Sayama, all of Tokyo, Japan

[73] Assignee: Mitsubishi Gas Chemical Company, Inc., Tokyo, Japan

[21] Appl. No.: 911,934

[22] Filed: Jul. 10, 1992

[30] Foreign Application Priority Data

| Jul. 26, 1991 | [JP] | Japan | 3-209939 |
| Jul. 26, 1991 | [JP] | Japan | 3-209940 |
| Jul. 26, 1991 | [JP] | Japan | 3-209941 |
| Jul. 26, 1991 | [JP] | Japan | 3-209942 |

[51] Int. Cl.$^5$ .............................................. B32B 9/00
[52] U.S. Cl. .................................. 428/209; 428/457; 428/901; 361/749
[58] Field of Search ................. 428/209, 901, 473.5, 428/690, 457, 210, 458; 250/484.1; 430/291, 288; 361/397, 398

[56] References Cited

U.S. PATENT DOCUMENTS

| 3,753,710 | 8/1973 | Jones et al. | 430/291 |
| 4,661,434 | 4/1987 | Iwasaki | 430/288 |
| 4,774,188 | 9/1988 | Chandross | 428/901 |

FOREIGN PATENT DOCUMENTS

| 0148787 | 7/1985 | European Pat. Off. |
| 0211667 | 3/1992 | European Pat. Off. |

OTHER PUBLICATIONS

Allen, "Photopolymerisation & Photoimaging Science & Technology", Elsevier App. Science, 1989, pp. 35–36.

Katritzky, "Comprehensive Heterocyclic Chemistry", Pergamon Press, 1984, pp. 338–341.

Streitweiser, "Intro to Organic Chemistry", MacMillan Press 1985, pp. 1097–1098.

Aldrich Chemical Catalogue, 1992, various pages.

*Primary Examiner*—Patrick J. Ryan
*Assistant Examiner*—Patrick Jewik
*Attorney, Agent, or Firm*—Wenderoth, Lind & Ponack

[57] ABSTRACT

A base board for a printed circuit board having a printed circuit formed from a copper foil on an insulating layer, the insulating layer containing a compound of the formula (1) or a compound of the formula (2).

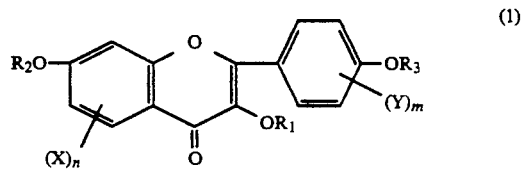

(1)

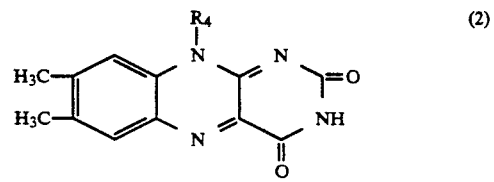

(2)

13 Claims, No Drawings

PRINTED CIRCUIT COMPRISING NOVEL COMPOUNDS AS FLUORESCENCE MEANS TO CONTROL CIRCUIT QUALITY

FIELD OF THE INVENTION

The present invention relates to a base board for a printed circuit board panel which permits easy inspection of a printed circuit by means of a fluorescence-applied circuit pattern inspection machine used for the inspection of printed circuit patterns and which is not altered in the properties as a printed circuit board.

PRIOR ART OF THE INVENTION

The circuit pattern of a printed circuit board is conventionally inspected by a direct continuity method using a probe, a metallurgical microscope-applied method using reflected light from a metal conductor circuit pattern, or a method using a soft X-ray.

The circuit pattern is recently beginning to be inspected by a more accurate and highly efficient method in which a pattern of fluorescence generated from the circuit pattern of a manufactured printed circuit board is compared with a pattern of fluorescence generated from the circuit pattern of a defect-free normal circuit pattern by means of a phenomenon that the resin layer of a printed circuit board generates fluorescence under irradiation with exciting light while a conductor pattern does not generate fluorescence.

However, when there is an internal layer of a circuit or when the resin layer is too thin, there are some cases where no sufficient inspection is possible, since fluorescence is not sufficiently strong, or the fluorescent pattern is affected by the presence or absence of the conductor circuit of the internal layer, the presence or absence of the conductor circuit on the surface opposite to the surface to be inspected, or a difference caused by whether or not a pigment and a filler are used.

To overcome the above defect, JP-A-3-2258 discloses a method using a fluorescent whitening agent, specifically a coumarin-containing fluorescent whitening agent. In this method, however, the amount of fluorescence is sometimes insufficient or the amount of fluorescence having a wavelength with which to inspect a pattern is sometimes small. The defect with this method is that when the amount of the fluorescent whitening agent is increased to overcome the above problem, the properties of the base board alter.

SUMMARY OF THE INVENTION

It is an object of the present invention to provide a base board for the manufacture of a printed circuit board which can be sufficiently inspected on its printed circuit by means of a fluorescence-applied circuit pattern inspection machine.

It is another object of the present invention to provide a base board containing a small amount of a specific compound which does not affect the properties of the board and enables the sufficient inspection of a printed circuit by means of a fluorescence-applied circuit pattern inspection machine.

It is further another object of the present invention to provide a base board which is excellent in shielding against light from a high-pressure mercury lamp and metal halide lamp and gives a printed circuit board which can be sufficiently inspected by means of a fluorescence-applied circuit pattern inspection machine.

According to the present invention, there is provided a base board for a printed circuit board having a printed circuit formed from a copper foil on an insulating layer, the insulating layer containing 0.3 to 0.0001% by weight of a compound of the formula (1),

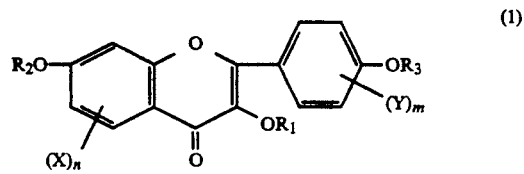

wherein each of $R_1$, $R_2$ and $R_3$ is independently alkyl, aryl, acyl, polysaccharide, alkyl ether of polysaccharide or an acylation product of polysaccharide, each of X and Y is independently, hydroxyl, alkoxy, acyloxy, aryloxy, polysaccharide, alkyl ether of polysaccharide or an acylation product of polysaccharide, n is an integer of 0 to 3, and m is an integer of 0 to 2, or a compound of the formula (2),

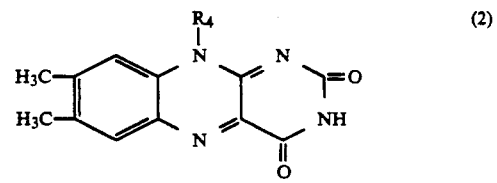

wherein $R_4$ is hydrogen, alkyl, aryl, acyl, polysaccharide, an alkyl etherified or acylated glycoside of polysaccharide, glycoside or flavin enzyme.

DETAILED DESCRIPTION OF THE INVENTION

The present inventors have made a diligent study to develop a base board which is processed into a printed circuit board and permits sufficient inspection of a printed circuit by a fluorescence-applied circuit pattern inspection method and which is not at all altered in properties for a printed circuit board. As a result, there has been found a base board which can sufficiently meet with a fluorescence-applied circuit pattern inspection machine, and on the basis of this finding, the present invention has been completed.

The base board of the present invention comprises an insulating layer containing a compound of the above formula (1) or (2), and includes a variety of base boards if their insulating layers contain a compound of the above formula (1) or (2).

When specifically classified in view of a layer structure, the base board of the present invention typically includes (1) a prepreg formed of a reinforcing substrate and a thermnosetting resin, (2) a copper-unclad laminate obtained by stacking a plurality of prepregs, (3) a single-side or both-side copper-clad laminate obtained by bonding copper foil(s) on one surface or both surfaces of the laminate, and (4) a copper-clad, multilayer board obtained by combining and laminating print wiring board(s) as internal layer(s), multilayer-forming prepreg(s) as bonding layer(s) and either a copper foil or a single-sided copper-clad laminate. In addition to these, the base board of the present invention also includes (5) a laminate having a metal core layer such as an aluminum layer or a copper-Invar, (6) a ceramic-resin composite board obtained by impregnating a porous ceramic board with a resin and curing the resin, (7) a copper-clad cermatic board obtained by bonding a copper foil on a ceramic-resin composite board optionally through a prepreg, and (8) a flexible, copper-clad board obtained by bonding a copper foil on a polyimide film with an adhesive.

The term "insulating layer" used in the present invention includes the above prepreg and a combination of the prepreg and an adhesive layer formed thereon.

The base board of the present invention is used to make it easier to inspect the printed circuit pattern formed on the surface thereof. Therefore, the compound of the above formula (1) or (2) is required to be contained in an insulating layer forming the surface layer of the base board. For example, in copper-clad laminate of any kind, the compound of the above formula (1) or (2) is contained in the layer underlying the copper foil.

The reinforcing substrate as a component for the above prepreg is selected from known reinforcing materials such as a woven or nonwoven fabric of glass and a woven or nonwoven fabric of a mixture of glass and other fiber. Particularly preferred is a nearly transparent reinforcing substrate which is formed from woven fabrics or nonwoven fabrics of a glass fiber such as E glass, S glass, D glass or quartz glass. Although not specially limited, the thickness of the reinforcing substrate is preferably 0.03 to 0.40 mm.

The thermosetting resin which is impregnated into the substrate or which is used as an adhesive layer to bond a copper foil on an outer layer is selected from a variety of known thermosetting resins. In the present invention, particularly preferred is an epoxy resin. The thermosetting resin includes epoxy resins such as a bisphenol A type epoxy resin, a novolak type epoxy resin, a halogenated bisphenol A type epoxy resin, a halogenated novolak type epoxy resin and other polyfunctional epoxy compounds having at least three functional groups; a mixture of the above epoxy resin with a heat-resistant engineering plastic such as polyether imide or polyphenylene ether, or a saturated or unsaturated polyester resin; a mixtures of the above epoxy resin with a known curing agent such as dicyandiamide or diaminodiphenylmethane, or a phenol such as a phenol novolak resin or acid anhydride; and a mixture of the above epoxy resin with an imidazole such as 2-methylimidazole, 2-ethyl-4-methylimidazole, 2-undecylimidazole, 2-heptadecylimidazole, 2-phenylimidazole, 1-benzyl-2-methylimidazole, or a curing catalyst such as benzyldimethylamine; and a mixture of the above epoxy resin with an inorganic filler, an organic filler, a flame retardant, a pigment or a dye. A thermosetting resin composition prepared by incorporating a polyvinyl butyral resin or a melamine resin into one of the above thermosetting resins may be also used as an adhesive layer.

The compound of the formula (1) is one type of naturally widely occurring flavonoids, and generally available are compounds of the formula (1) in which each of $R_1$, $R_2$, $R_3$, X and Y is hydrogen or hydroxyl. Specifically, examples of the compound of the formula (1) include fisetin, a compound of the formula (1) in which the substituent on each of the 3-, 7-, 3'- and 4'-positions is hydrogen or hydroxyl, kaempferol, a compound of the formula (1) in which the substituent on each of the 3-, 5-, 7- and 4'-positions is hydroxyl, quercetin, a compound of the formula (1) in which the substituent on each of the 3-, 5-, 7-, 3'-and 4'-is hydroxyl, quercetagetin, a compound of the formula (1) in which the substituent on each of the 3-, 5-, 6-, 7-, 3'- and 4'-positions is hydroxyl, robinetin, a compound of the formula (1) in which the substituent on each of the 3-, 7-, 3'-, 3'- and 4'-positions is hydroxyl, and hibiscetin, a compound of the formula (1) in which the substituent on each of the 3-, 5-, 7-, 8-, 3'-, 3'- and 4'-positions is hydroxyl. Further, the compound of the formula (1) includes glycosides derived from the above compounds, in which glucose, rhamnose or glucuronic acid is substituted for one or some of the hydroxyl groups, such as quercitrin, isoquercitrin, quercimeritrin, avicularin, hyperin, reynoutrin, quercituron, rutin, quercetagitrin, glucolteolin, kaempferitrin, kaempferol-3-arabinoside, kaempferol-3-rhamnoglucoside and hibiscitrin.

Further, the compound of the formula (1) also includes esterification products and etherification products obtained by reacting the hydroxyl group(s) of not only the compound of the formula (1) but also of the glycosides with a carboxylic acid or an alcohol, such as patuletin, octacetylquercimeritrin, pentamethyletherquercimeritrin, hexaacetylquercetagetin, hexamethyletherquercetagetin, pentaacetylquercetin, pentamethyletherquercetin, triacetylkaempferid, 5,7,4'-trimethyletherkaempferol, 3,5,4'-trimethyletherkaempferol, 3,7,4'-trimethyletherkaempferol, heptaacetylhibiscetin, heptamethyletherhibicetin, tetraacetylfisetin, tetramethyletherfisetin, tetrabenzoylfisetin, tetramethyletherfisetin, and dodecaneacetylrobinin. These compounds may be used alone or in combination.

The compound of the formula (2) is naturally widely occurring as a flavin coenzyme in which $R_4$ is substituted on an isoalloxazine ring, and its typical example is a riboflavin (vitamin B2), a compound of the formula (2) in which $R_4$ is ribitol. The compound of the formula (2) also includes flavin glucoxide, flavin mononucleotide, flavin adeninenucleotide and flavin adeninenucleotide pyrophosphorylase. Further, a compound of the formula (2) in which $R_4$ is alkyl, aryl, or the like may be used.

The amount of the compound of the formula (1) or (2) in the insulating layer is in the range of 0.3 to 0.0001% by weight. When this amount exceeds 0.3% by weight, the amount of fluorescence is undesirably too large. When it is less than 0.0001% by weight, the amount of fluorescence is undesirably too small. When the compound of the formula (1) or (2) is incorporated into the thermosetting resin to be used in a prepreg, its amount is in the range of 0.1 to 0.0005% by weight, preferably 0.03 to 0.001% by weight. When the compound of the formula (1) or (2) is incorporated into the thermosetting resin to be used to form an adhesive layer (in this case, the insulating layer is formed of the adhesive layer and a prepreg), its amount is in the range of 0.3 to 0.001% by weight, preferably 0.1 to 0.003. When the compound of the formula (1) or (2) is allowed to adhere to the reinforcing substrate, its amount is in the range of 0.2 to 0.0001, preferably 0.1 to 0.001, particularly preferably 0.1 to 0.006. The optimum amount of the compound of the formula (1) and (2) is properly determined depending upon a formulation method, etc.

When the compound of the formula (1) or (2) used in the present invention is excited with laser light having a wavelength of 442 nm to emit fluorescence, the wavelength of at least 60% of the fluorescence is preferably in the range of 490 to 620 nm which is the wavelength used for the inspection. Further, the compound of the formula (1) or (2) shows the following tendency: As the molecular weights of the $R_1$ to $R_4$, X and Y increase, the wavelength of the generated fluorescence shifts towards a longer wavelength region. Accordingly, the substituents as $R_1$, etc., can be properly selected so as to satisfy the above condition. Further, the content of the compound of the formula (1) or (2) in the insulating layer is preferably set in such an amount that the amount of fluorescence having a wavelength of 490 to 620 nm generated from the insulating layer under the irradiation with a laser having a wavelength of 442 nm is at least ten times the amount of fluorescence having the same wavelength generated from the same insulating layer containing no compound of the formula (1) or (2). That is, the content of the compound of the formula (1) or (2) in the above range is effective for efficient and easy inspection.

When the compound of the formula (1) or (2) is allowed to adhere to the reinforcing substrate, it is necessary to take into account the kind of the compound, particularly its solubility in solvents. When the compound of the formula (1) or (2) is water-soluble, it is preferred to dissolve the compound in a solution of a conventional silane-coupling agent, and the reinforcing substrate is immersed in the solution. When the compound of the formula (1) or (2) is soluble in an organic solvent, it is preferred to dissolve the compound, particularly, in a low-boiling-point, generally usable solvent, and the reinforcing substrate is immersed in the so-prepared solution.

The prepreg containing the compound of the formula (1) or (2), used in the present invention, is prepared by any one of the following methods.

(i) The reinforcing substrate to which the compound of the formula (1) or (2) is adhering is impregnated with the thermosetting resin and the thermosetting resin is dried to convert it into a B-stage.

(ii) The reinforcing substrate is immersed in the thermosetting resin composition containing the compound of the formula (1) or (2), and dried to convert the resin to a B-stage.

(iii) A layer of the thermosetting resin containing the compound of the formula (1) or (2) is formed on the prepreg.

The copper foil with an adhesion layer containing the compound of the formula (1) or (2), provided by the present invention, is produced by forming a layer of the thermosetting resin composition containing the compound of the formula (1) or (2) on that surface of a copper foil which is treated for bonding it to a prepreg.

The base board for a printed circuit board is produced by laminating either the prepreg containing the compound of the formula (1) or (2) or the above prepreg with a copper foil and a conventional prepreg. The prepreg containing the compound of the formula (1) or (2) may be used as an adhesive layer to which a copper foil is bonded.

In the base board for a printed circuit board, a compound which absorbs, or works as a shield against, light having a wavelength of 300 to 420 nm for exposure may be incorporated into the prepreg or the adhesive layer to prevent the transmission of light (from a high-pressure mercury lamp or a metal halide lamp) to the reverse side of the board when a resist pattern is formed.

The above compound includes photopolymerization initiators generally used in a composition which contains a compound having an unsaturated carbon-carbon double bond such as acrylate and photopolymerized under irradiation with ultraviolet light such as acetophenone, benzoin, α-acyloxime ester, acylphosphine oxide, substituted α-aminoketone, hydrogen-eliminating Michler's ketone, thioxanthone and alkylthioxanthone; photopolymerization aids which promote the activation by irradiation with ultraviolet light such as acenaphthene and fluorene; benzotriazoles or ultraviolet light absorbers such as 2-(2-hydroxy-5-methylphenyl)benzotriazole, 2-(2-hydroxy-3,5-di-tert-butylphenyl)benzotriazole, 2-(2-hydroxy-3,5-di-tert-amylphenyl)benzotriazole and 2-(2-hydroxy-3-tertbutyl-5-methylphenyl)-5-chlorobenzotriazole; and fluorescent brighteners.

In the present invention, preferred are those containing alkylthioxanthone of the following formula (3) in view of toxicity, a laminate color and physical properties in addition to the properties of shielding from light for exposure.

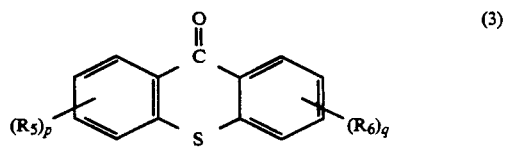

wherein each of $R_5$ and $R_6$ is alkyl, each of p and q is an integer of 0 to 4, and $p+q \geq 1$.

Specifically, preferred are 2,4-diethylthioxanthone, 2,4-diisopropylthioxanthone, 2,4-dimethylthioxanthone and 4-isopropylthioxanthone. In particular, the use of alkylthioxanthone in combination with an ultraviolet light absorber is preferred to achieve more highly effective shielding properties.

The amount thereof for use is in the range of 0.2 to 6% by weight based on the total solid content of the thermosetting resin. When the thickness of the laminate is small, when it is used in one part of the prepreg, or when it is incorporated into only the adhesive layer for a copper foil, it is used in a relatively larger amount in the range of 1 to 6% by weight, particularly 2 to 6% by weight. When the thickness is large and when it is entirely uniformly mixed, it is used in a relatively small amount in the range of 0.2 to 2% by weight. When the amount is less than 0.2% by weight, the ultraviolet light absorption capability is insufficient. Any amount exceeding 6.0% by weight is an excess and unnecessary.

The present invention will be described hereinafter by reference to Examples, in which "part" and "%" are based on weight unless otherwise specified.

EXAMPLES 1 and 2

100 Parts of a brominated bisphenol A type epoxy resin (trade name: Epikote 1045, Br content 18-20%, epoxy equivalent 450-500, supplied by Yuka Shell Epoxy Kabushiki Kaisha), 3.5 parts of dicyandiamide and 0.2 part of 2-methylimidazole were dissolved in a mixed solvent prepared from methyl ethyl ketone and N,N-dimethylformamide to obtain an epoxy resin varnish (to be referred to as V1 hereinafter).

Fisetin was added to the above V1 in such an amount that the proportion of the fisetin based on the resin solid content was 0.003%, and a plain-woven glass fabric having a thickness of 0.1 mm was impregnated with the so-prepared varnish. Separately, fisetin was also added to the same varnish as the above V1 in such an amount that the proportion of the fisetin based on the resin solid content was 0.03%, and the same plain-woven glass fabric as above was impregnated with the so-prepared varnish. These impregnated fabrics were dried at 160° C. for 6 minutes to give slightly yellow-colored prepregs having a resin content of 45% (to be referred to as PP1 and PP2 hereinafter).

An electrolytic copper foil having a roughened surface for adhesion and having a thickness of 35 μm was placed on both surfaces of each of the above PP1 and PP2, and laminate-molded at 170° C. at 30 kg/cm² for 2 hours to give both-side copper clad laminates having an insulating layer thickness of 0.1 mm.

The above-obtained copper-clad laminates were etched to remove the entire copper foil from one surface each and a half of the copper foil from the other surface each (double-side copper-removed portion-=unclad surface, and one-side copper-removed portion=copper-clad surface).

These copper-clad laminates were measured for an amount of generated fluorescence (to be referred to as "relative fluorescence amount" hereinafter) with Vision 206E (supplied by OPTROTECH Ltd.) in the following manner. Table 1 shows the results.

In the Vision 206E, a sample was irradiated and scanned with laser light having a wavelength of 442 nm from a laser positioned above, and at the same time, fluorescence having a wavelength of 490 to 620 nm from the irradiated portion was detected with a fluorescence detector positioned above.

That is, a standard plate having fluorescent strength 100 times the fluorescent strength of a 0.1 mm thick glass epoxy, double side copper-clad laminate containing no fluorescence agent was set in the Vision 206E, and the detection sensitivity of the Vision 206E was adjusted under irradiation with laser light such that the detected fluorescent strength was 100 times the fluorescent strength of the above standard. A sample was set and measured for a fluorescent strength as described above. The so-obtained values were expressed as a relative fluorescence amount.

EXAMPLE 3

A prepreg (to be referred to as PP3 hereinafter) was prepared in the same manner as in Example 1 except that the varnish for impregnation was replaced with a varnish prepared by adding fisetin, 2,4-diethylthioxanthone (to be referred to as ESX hereinafter) and 2-(2-hydroxy-3,5-ditert-amylphenyl)benzotriazole (to be referred to as BTA hereinafter) to V1 in such amounts that the proportions of these additional components in the above order based on the resin solid content were 0.003%, 2.0% and 2.0%. Then, a double-side copper-clad laminate was prepared and measured for a relative fluorescence amount in the same manner as in Example 1. Table 1 shows the result.

Further, all the remaining copper foil was removed from the above laminate by etching. The so-prepared laminate was placed in a distance of 20 cm from a high-pressure mercury lamp (wavelength 300–400 nm, 1 kW, H1 type, supplied by USHIO U-TECH Inc.) and irradiated with light from the high-pressure mercury lamp up to 1,000 mJ/cm² to measure light transmissivity and amounts of transmitted light. Further, the above laminate was also irradiated with light from a metal halide lamp (wavelength 380–420 nm, 1 kW, GL type, supplied by USHIO U-TECH, Inc.) at a light intensity of 24 mW/cm² up to 1,000 mJ/cm to measure light transmissivity and amounts of transmitted light (to be referred to as "exposure light shielding properties" hereinafter). Table 2 shows the results.

EXAMPLES 4-7

Prepregs (to be referred to as PP4 to PP7 hereinafter) were prepared in the same manner as in Examples 1 and 2 except that the fisetin was replaced with quercetin or kaempferol, and then double-side copper-clad laminates were prepared from PP4 to PP7 and measured for relative fluorescence amounts in the same manner as in Example 1. Table 1 shows the results.

COMPARATIVE EXAMPLES 1-3

A prepreg (to be referred to as PPC hereinafter) was prepared in the same manner as in Example 1 and 2 except that the varnish for impregnation was replaced with V1 (Comparative Example 1). Prepregs (to be referred to as PPC1 and PPC2 hereinafter) were prepared in the same manner as in Examples 1 and 2 except that the varnish for impregnation was replaced with varnishes prepared by adding coumarin-based fluorescent brightener to V1 in such amounts that the proportions of the brightener based on the resin solid content were 0.03% and 0.1%. Double-side copper-clad laminates were prepared and measured for relative fluorescence amounts in the same manner as in Example 1. Table 1 shows the results.

As shown in Table 1, the increase of the fluorescence agent amount is not in proportion to the increase of the relative fluorescence amount. That is, when the amount of the fluorescence agent was increased up to 10 times, the relative fluorescence amount increased up to 3 to 5 times. Further, the relative fluorescence amount in an unclad surface was much larger than about 2 times expected on the basis of a simple model, that is, it was about 3 to 5 times larger than that in a copper-clad surface.

The reasons for the above phenomenon are not clear, but assumed as follows. An epoxy resin is sensitized with fluorescence from the fluorescence agent to generate fluorescence, or laser light is irregularly reflected within the insulating layer, on the insulating layer surface and on a bed on which a sample is placed. Therefore, the volume from which fluorescence is generated increases.

TABLE 1

| Example | Prepreg | Compound | Proportion | Relative fluorescence amount | |
|---|---|---|---|---|---|
| | | | | Unclad surface | Copper-clad surface |
| Ex. 1 | PP1 | fisetin | 0.003 | 214 | 50 |
| Ex. 2 | PP2 | fisetin | 0.03 | 800 | 250 |
| Ex. 3 | PP3 | fisetin | 0.03 | 200 | 50 |
| | | ESX | 2.0 | | |
| | | BTA | 2.0 | | |
| Ex. 4 | PP4 | quercetin | 0.003 | 140 | 35 |
| Ex. 5 | PP5 | quercetin | 0.03 | 500 | 130 |
| Ex. 6 | PP6 | kaempferol | 0.003 | 100 | 30 |
| Ex. 7 | PP7 | kaempferol | 0.03 | 300 | 80 |
| CEx. 1 | PPC | — | — | 3.0 | 1.0 |
| CEx. 2 | PPC1 | coumarin-based | 0.03 | 4.0 | 1.0 |
| CEx. 3 | PPC2 | coumarin-based | 0.1 | 7.1 | 1.5 |

Ex. = Example,
CEx. = Comparative Example

TABLE 2

(Exposure light shielding properties of laminates obtained from PP3)

High-pressure mercury lamp

TABLE 2-continued (Exposure light shielding properties of laminates obtained from PP3)

| Irradiation dose (mJ/cm$^2$) | 300 | 500 | 700 | 1,000 |
|---|---|---|---|---|
| Transmissivity (%) | 0 | 0 | 0 | 0 |
| Amount of transmitted light (mJ/cm$^2$) | 0 | 0 | 0 | 0 |
| Metal halide lamp | | | | |
| Irradiation dose (mJ/cm$^2$) | 300 | 500 | 700 | 1,000 |
| Transmissivity (%) | 4.3 | 2.8 | 2.0 | 1.4 |
| Amount of transmitted light (mJ/cm$^2$) | 13 | 14 | 14 | 14 |

EXAMPLE 8

A plain-woven glass fabric substrate having a thickness of 0.1 mm was treated with a solution of fisetin in methyl ethyl ketone to prepare a substrate having a fisetin adhesion amount of 0.05% (to be referred to as BM1 hereinafter).

The above-prepared substrate was impregnated with the same V1 as that prepared in Example 1, and dried at 160° C. for 6 minutes to give a prepreg having a resin content of 45% (to be referred to as PP8 hereinafter).

A double-side copper-clad laminate was prepared from the above PP8 and treated in the same manner as in Example 1, and the thus-prepared copper-clad laminate was measured for a relative fluorescence amount in the same manner as in Example 1. Table 3 shows the result.

EXAMPLE 9

A prepreg (to be referred to as PP9 hereinafter) was prepared in the same manner as in Example 8 except that the V1 was replaced with a varnish prepared by adding 2,4-dimethylxanthone (to be referred to as MSX hereinafter) and BTA to V1 in such amounts that the proportion of each of these additional components in this order based on the resin content was 2.0%.

A double-side copper-clad laminate was prepared from the above PP9 and treated in the same manner as in Example 1, and the thus-prepared copper-clad laminate was measured for a relative fluorescence amount in the same manner as in Example 1. Table 3 shows the result.

Further, the above-obtained copper-clad laminate was measured for exposure light shielding properties in the same manner as in Example 3 to show the same results as those in Example 3 (laminate from PP3) within a measurement error range.

COMPARATIVE EXAMPLES 4 AND 5

Prepregs (to be referred to as PPC3 and PPC4 hereinafter) were prepared in the same manner as in Examples 8 and 9 except that the fisetin was replaced with a coumarin-based fluorescent brightener.

Double-side copper-clad laminates were prepared from the above PPC 3 and PPC4 and treated in the same manner as in Example 1, and the thus-prepared copper-clad laminates were measured for a relative fluorescence amount in the same manner as in Example 1. Table 3 shows the results.

EXAMPLES 10-13

Prepregs (to be referred to as PP10 and PP11 hereinafter) were prepared in the same manner as in Examples 8 and 9 except that the solution of fisetin in methyl ethyl ketone was replaced with a solution of quercetin in methyl ethyl ketone.

Prepregs (to be referred to as PP12 and PP13 hereinafter) were prepared in the same manner as in Examples 8 and 9 except that the solution of fisetin in methyl ethyl ketone was replaced with a solution of kaempferol in methyl ethyl ketone.

Double-side copper-clad laminates were prepared from the above PP10, PP11, PP12 and PP13 and treated in the same manner as in Example 1, and the thus-prepared copper-clad laminates were measured for a relative fluorescence amount in the same manner as in Example 1. Table 3 shows the results.

TABLE 3

| | | | | Relative fluorescence amount | |
|---|---|---|---|---|---|
| Example | Prepreg | Compound | Proportion | Unclad surface | Copper-clad surface |
| Ex. 8 | PP8 | fisetin | 0.05* | 160 | 50 |
| Ex. 9 | PP9 | fisetin | 0.05* | 150 | 45 |
| | | MSX | 2.0 | | |
| | | BTA | 2.0 | | |
| Ex. 10 | PP10 | quercetin | 0.05* | 130 | 40 |
| Ex. 11 | PP11 | quercetin | 0.05* | 125 | 37 |
| | | MSX | 2.0 | | |
| | | BTA | 2.0 | | |
| Ex. 12 | PP12 | kaempferol | 0.05* | 140 | 43 |
| Ex. 13 | PP13 | kaempferol | 0.05* | 135 | 40 |
| | | MSX | 2.0 | | |
| | | BTA | 2.0 | | |
| CEx. 4 | PPC3 | coumarin | 0.05* | 5 | 1 |
| CEx. 5 | PPC4 | coumarin | 0.05* | 4 | 1 |
| | | MSX | 2.0 | | |
| | | BTA | 2.0 | | |

*adhering to substrate (of plain-woven glass fabric)
Ex. = Example,
CEx. = Comparative Example

EXAMPLES 14-21 AND COMPARATIVE EXAMPLES 5 AND 6

Plain-woven glass fabrics having a thickness of 0.1 mm were impregnated with the same V1 as that prepared in Example 1 and dried at 160° C. for 6 minutes to obtain prepregs having a resin content of 45% (to be referred to as PPN1 hereinafter).

Prepregs having exposure light shielding properties (to be referred to as PPN2 hereinafter) were prepared in the same manner as above except that the V1 was replaced with a varnish prepared by adding ESX and BTA to V1 in such amounts that the proportion of each of ESX and BTA based on the resin solid content was 2.0%.

Prepregs containing a filler and having a solid content of 60% (filler content 24%) (to be referred to as PPN3 hereinafter) were prepared in the same manner as above except that the V1 was replaced with a varnish prepared by adding mica to V1 in such an amount that the proportion of the mica based on the solid content was 40%.

Separately, fisetin was added to V1 in such an amount that the proportion of fisetin based on the resin solid content was 0.1%, to give a thermosetting resin composition (AR1) for forming an adhesive layer, and further, fisetin was added to V1 in such amount that the proportion of fisetin based on the resin content was 0.01%, to give a thermosetting resin composition (AR2) for forming an adhesive layer.

AR1 was applied to both surfaces of each of PPN1, PPN2 and PPN3 and one surface of each of electrolytic copper foils having a thickness of 35 μm such that the thickness of the applied AR1 was 20 μm, and then the applied AR1 was dried to give prepregs having an adhesion layer (to be referred to as PPN1AR1, PPN2AR1 and PPN3AR1 hereinafter) and copper foils having an adhesion layer (to be referred to as CuAR1). AR2 was also applied to PPN1, PPN2, PPN3 and electrolytic copper foils in the same manner as above and dried to give prepregs having an adhesion layer (to be referred to as PPN1AR2, PPN2AR2 and PPN3AR2 hereinafter) and copper foils having an adhesion layer (to be referred to as CuAR2).

The above-prepared prepregs and the above-prepared copper foils or the same copper foils as above were laminated to prepare double-side copper-clad laminates having laminate structures shown in Table 4. Then, these copper-clad laminates were treated in the same manner as in Example 1, and measured for a relative fluorescence amount in the same manner as in Example 1. Table 4 shows the results.

For comparison, thermosetting resin compositions (to be referred to as ARC1 and ARC2 hereinafter) were prepared in the same manner as above except that a coumarin-based fluorescent brightener was added to V1 such that the proportions of the brightener were 0.03% and 0.1%. And, ARC1 was applied to both surfaces of PPN1, and ARC2 was also applied to both surfaces of PPN1, in the same manner as above to prepare prepregs having an adhesive layer (to be referred to as PPN1ARC1 and PPN1ARC2 hereinafter). These prepregs and the same copper foils as above were laminated to prepare double-side copper-clad laminates. Then, these copper-clad laminates were treated in the same manner as in Example 1, and measured for a relative fluorescence amount in the same manner as in Example 1. Table 4 shows the results.

Further, the copper-clad laminate obtained in Example 16 was measured for exposure light shielding properties in the same manner as in Example 3 to show the same results as those in Example 3 (laminate from PP3) within a measurement error range.

TABLE 4

| Example | Laminate structure | Compound in AR | Relative fluorescence amount | |
|---|---|---|---|---|
| | | | Unclad surface | Copper-clad surface |
| Ex. 14 | Cu-PPN1AR1/Cu | fisetin 0.1 | 310 | 80 |
| Ex. 15 | Cu/PPN1AR2/Cu | fisetin 0.01 | 150 | 45 |
| Ex. 16 | Cu/PPN2AR1/Cu | fisetin 0.1 | 320 | 85 |
| Ex. 17 | Cu/PPN2AR2/Cu | fisetin 0.01 | 155 | 50 |
| Ex. 18 | Cu/PPN3AR1/Cu | fisetin 0.1 | 240 | 60 |
| Ex. 19 | Cu/PPN3AR2/Cu | fisetin 0.01 | 130 | 35 |
| Ex. 20 | CuAR1/PPN1/CuAR1 | fisetin 0.1 | 300 | 78 |
| Ex. 21 | CuAR2/PPN1/CuAR2 | fisetin 0.01 | 145 | 43 |
| CEx. 6 | Cu/PPN1ARC1/Cu | coumarin 0.03 | 4.0 | 1.0 |
| CEx. 7 | Cu/PPN1ARC2/Cu | coumarin 0.1 | 7.0 | 1.5 |

Ex. = Example,
CEx. = Comparative Example

EXAMPLES 22-25

Prepregs (to be referred to as PP22 and PP23 hereinafter) were prepared in the same manner as in Example 1 except that the varnish for impregnation was replaced with a varnish prepared by adding riboflavin (to be referred to as RFA hereinafter) to V1 in such amounts that the proportions of the riboflavin based on the resin solid content were 0.003% (for PP22) and 0.03% (for PP23).

A prepreg (to be referred to as PP24 hereinafter) was prepared in the same manner as in Example 1 except that the varnish for impregnation was replaced with a varnish prepared by adding RFA, ESX and BTA to V1 in such amounts that the proportions of these additional components in the above order based on the resin solid content were 0.003%, 2.0% and 2.0%.

A plain-woven glass fabric having a thickness of 0.1 mm was treated with a silane coupling agent containing flavin adenine dinucleotide (to be referred to as FAD hereinafter) to prepare a substrate having a FAD addition amount of 0.05%, and this prepreg was impregnated with V1 to obtain a prepreg having a resin content of 45% (to be referred to as PP25 hereinafter).

Double-side copper-clad laminates were prepared from the above PP22 to PP25 and treated in the same manner as in Example 1, and the thus-prepared copper-clad laminates were measured for a relative fluorescence amount in the same manner as in Example 1. Table 5 shows the results.

Further, the double-side copper-clad laminate obtained from PP22 was measured for exposure light shielding properties in the same manner as in Example 3 to show the same results as those in Example 3 (laminate from PP3) within a measurement error range.

TABLE 5

| Example | Prepreg | Compound | Proportion | Relative fluorescence amount | |
|---|---|---|---|---|---|
| | | | | Unclad surface | Copper-clad surface |
| Ex. 22 | PP22 | RFA | 0.003 | 190 | 55 |
| Ex. 23 | PP23 | RFA | 0.03 | 450 | 130 |
| Ex. 24 | PP24 | RFA +ESX +BTA | 0.003 2.0 2.0 | 180 | 50 |
| Ex. 25 | PP25 | FAD | 0.05* | 200 | 60 |

*Adhering to substrate (of plain-woven glass fabric)
Ex. = Example,
CEx. = Comparative Example The base board for a printed circuit board, provided by the present invention, contains a small amount of the compound of the formula (1) or (2) and sufficiently generates fluorescence so that a printed circuit pattern can be easily inspected by means of a fluorescence-applied circuit pattern inspection machine.

The base board for a printed circuit board can be produced as a print wiring board having excellent light shielding properties against light from a high-pressure mercury lamp and a metal halide lamp.

What is claimed is:

1. A base board for a printed circuit board having a printed circuit formed from a copper foil on an insulating layer said base board being an insulating layer or having an insulating layer thereon, the insulating layer containing 0.3 to 0.0001% by weight of a compound of the formula (I),

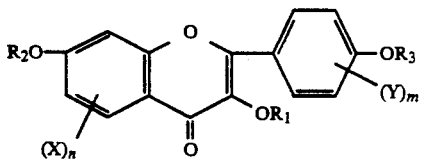

(1)

wherein each of $R_1$, $R_2$ and $R_3$ is independently alkyl, aryl, acyl, polysaccharide, alkyl ether of polysaccharide or an acylation product of polysaccharide, each of X and Y is independently, hydroxy, alkoxy, acyloxy, aryloxy, polysaccharide, alkyl ether of polysaccharide or an acylation product of polysaccharide, n is an integer of 0 to 3, and m is an integer of 0 to 2,
or a compound of the formula (2),

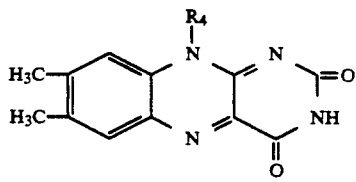

(2)

wherein $R_4$ is hydrogen, alkyl, aryl, acyl, polysaccharide, an alkyl etherified or acylated glycoside of polysaccharide, glycoside or flavin co-enzyme.

2. A base board according to claim 1, wherein the insulating layer is formed of at least one prepreg formed from a reinforcing substrate and a thermosetting resin.

3. A base board according to claim 2, wherein the thermosetting resin contains a compound of the formula (1) or (2) in an amount of 0.03 to 0.001% by weight based on the thermosetting resin.

4. A base board according to claim 2, wherein the reinforcing substrate has a compound of the formula (1) or (2) adhering thereto in an amount of 0.1 to 0.001% by weight based on the reinforcing substrate.

5. A base board according to claim 1, wherein the insulating layer is formed of a prepreg and an adhesive layer containing a compound of the formula (1) or (2) in an amount of 0.03 to 0.001% by weight based on the adhesive layer.

6. A base board according to claim 5, wherein the adhesive layer is formed on that surface of a copper foil which is to be bonded to a prepreg.

7. A base board according to claim 2, wherein the thermosetting resin further contains a light-shielding compound which absorbs, or works as a shield against, light having a wavelength of 300 to 420 nm.

8. A base board according to claim 7, wherein the light-shielding agent is an alkylthioxanthone of the formula (3),

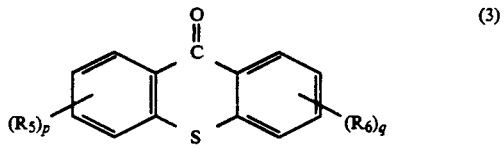

(3)

wherein each of $R_5$ and $R_6$ is alkyl, each of p and q is an integer of 0 to 4, and $p+q \geq 1$.

9. A base board according to claim 7, wherein the thermosetting resin contains the light-shielding agent in an amount of 0.2 to 6.0% by weight based on the thermosetting resin.

10. A base board according to claim 1, wherein the compound of the formula (1) or (2) is generated by laser light having a wavelength of 442 nm to generate fluorescence and at least 60% of an amount of the generated fluorescence is in the wavelength range of 490 to 600 nm.

11. A base board according to claim 1, wherein the insulating layer contains the compound of the formula (1) or (2) in such an amount that the amount of fluorescence generated from the insulating layer by irradiation with laser light having a wavelength of 442 nm is at least 10 times the amount of fluorescence from an insulating layer containing no compound of the formula (1) or (2).

12. A base board according to claim 1, which is a multi-layer board obtained by laminate molding of a prepreg formed of a reinforcing substrate and a thermosetting resin, a print wiring board for forming an internal layer and either a copper foil or a one-side copper clad laminate.

13. A base board according to claim 1, which is a laminate formed by laminating a copper foil onto one face surface of a prepreg formed of a reinforcing substrate and a thermosetting resin or a laminate formed by laminating a copper foil onto each of the face surfaces of a prepreg formed of a reinforcing substrate and a thermosetting resin.

* * * * *